(12) United States Patent
Becker et al.

(10) Patent No.: US 7,105,840 B2
(45) Date of Patent: Sep. 12, 2006

(54) ION SOURCE FOR USE IN AN ION IMPLANTER

(75) Inventors: Klaus Becker, Kensington, NH (US); Werner Baer, Beverly, MA (US); Klaus Petry, Merrimac, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 11/049,913

(22) Filed: Feb. 3, 2005

(65) Prior Publication Data

US 2006/0169921 A1    Aug. 3, 2006

(51) Int. Cl.
*G21K 5/10* (2006.01)
*H01J 37/08* (2006.01)

(52) U.S. Cl. ................................. 250/492.21
(58) Field of Classification Search ............ 250/492.21

See application file for complete search history.

(56) References Cited

U.S. PATENT DOCUMENTS 5,977,552 A * 11/1999 Foad .................. 250/492.21

* cited by examiner

*Primary Examiner*—Jack Berman
*Assistant Examiner*—Jennifer Yantorno
(74) *Attorney, Agent, or Firm*—Watts, Hoffmann, Co., LPA

(57) ABSTRACT

An ion implanter having a source, a workpiece support and a transport system for delivering ions from the source to an ion implantation chamber that contains the workpiece support. The ion source has an arc chamber for ionizing a source material routed into the arc chamber that defines an exit aperture for routing ions to the transport system and including an arc chamber flange attached to the arc chamber and including a first surface that defines a gas inlet which accepts gas from a source and a gas outlet which opens into the arc chamber. An arc chamber support includes a support flange having a conforming surface that sealingly engages the first surface of arc chamber flange at a region of the gas inlet and further includes a throughpassage that aligns with the gas inlet. A gas supply line routes gas from a gas source through the throughpassage of the support flange and into the gas inlet of said arc chamber flange.

7 Claims, 4 Drawing Sheets

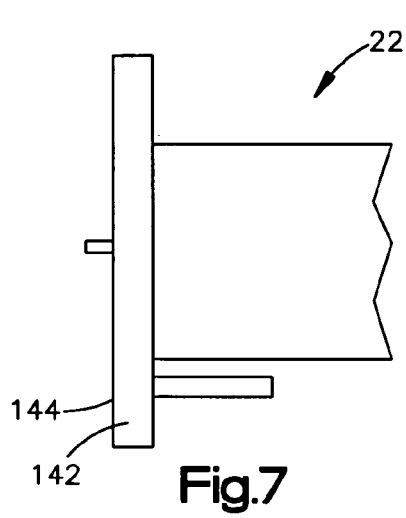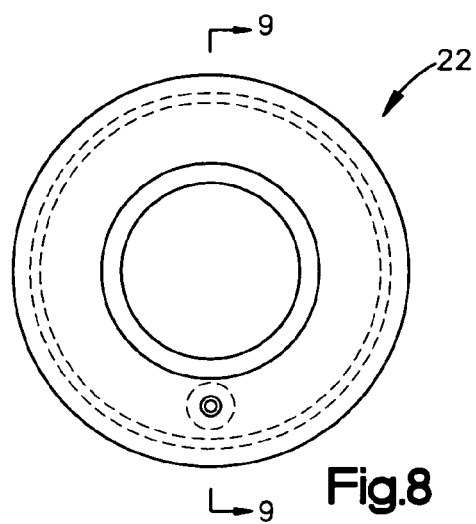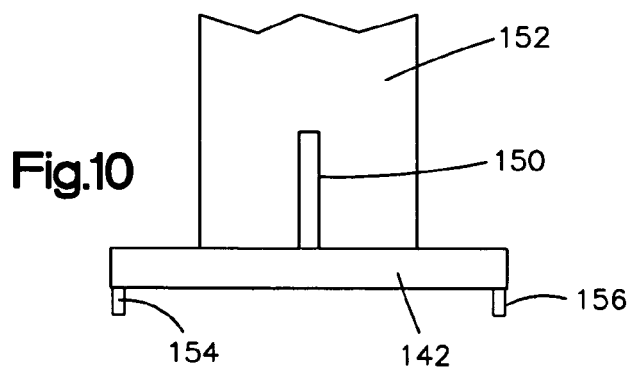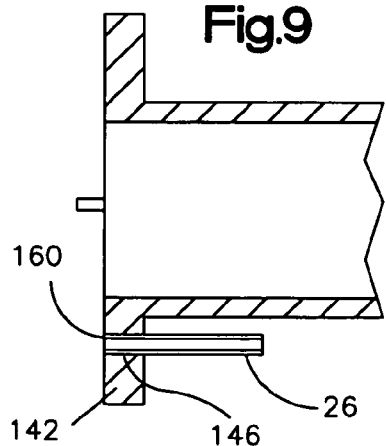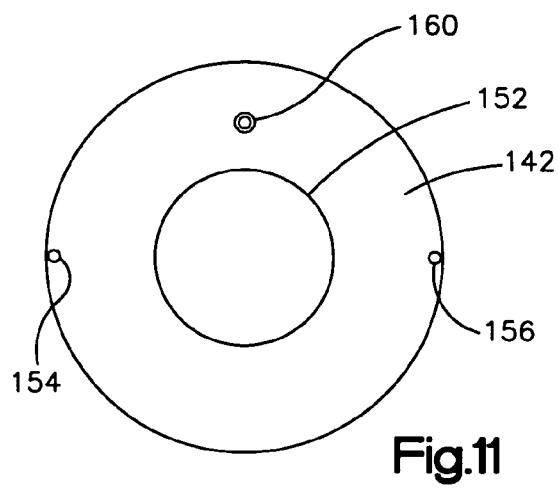

ION SOURCE FOR USE IN AN ION IMPLANTER

FIELD OF THE INVENTION

The present invention concerns semiconductor processing equipment generally and more specifically relates to ion implanters and a source of ions for such an implanter.

BACKGROUND ART

Ion implanters are known for use in treating workpieces such as silicon wafers. When such a wafer is bombarded with an ion beam, the silicon wafer is selectively doped with the ion impurity to create a semiconductor material from the original silicon material of the wafer. It is well known to create complex integrated circuits using such wafers. Circuit components on a small scale are created through use of masking techniques that selectively limit the exposure of the silicon to bombardment with the ions coming from an ion source.

Ion implanters generally fall into different categories that depend on their intended use. One class implanter has a support that supports multiple wafers which are moved through a suitably shaped ion beam. Other implanters treat or process one wafer at a time. In these so called serial implanters, the single wafer is mounted to a support that translates back and forth through a thin ribbon shaped beam coming from an ion source.

Both type implanters include a source of ions which typically ionize a source material such as Boron in either a gaseous or solid state and selectively accelerate and filter the resultant ion species to form a ribbon or pencil beam having a controlled dose and energy. A typical ion source is a high frequency replacement item for the ion implanter. The source includes an arc chamber in which the source material is ionized by means of a filament mounted within the arc chamber. A plasma of ions is created which are extracted from the arc chamber and then accelerated. In a chamber using a gaseous source material, the gas must be routed into the chamber from a source at atmospheric pressure to the sub atmospheric arc chamber. In the prior art when an arc chamber is replaced, a seal to atmosphere is broken between the gas source and the arc chamber.

SUMMARY OF THE INVENTION

The present disclosure concerns an ion source most preferably for use with semiconductor processing equipment having a workpiece support positioned in relation to the ion source and a transport system for delivering ions from the source to the workpiece support.

The ion source includes an arc chamber for ionizing a source material routed into the arc chamber and including an arc chamber body attached to the arc chamber and including a gas inlet which accepts gas from a source and a gas outlet which opens into the arc chamber and an arc chamber support which sealingly engages the arc chamber body at a region of the gas inlet and including a gas supply line for routing gas from a gas source to the gas inlet.

The disclosed ion source makes replacement of the source easier and thereby avoids lengthy periods of ion implanter downtime. These and other advantages and features of the disclosed embodiment are described in conjunction with the accompanying drawings.

BRIEF DESCRIPTION OF THE DRAWINGS

FIG. 7 is side elevation view of an arc chamber support;

FIG. 8 is a bottom plan view of the support of FIG. 7;

FIG. 9 is a view as seen from the plane 9—9 of FIG. 8;

FIG. 10 is side elevation view of the support of FIG. 7;

FIG. 11 is a top plan view of the mounting flange of FIG. 7;

EXEMPLARY EMBODIMENTS OF THE INVENTION

Figure 1:
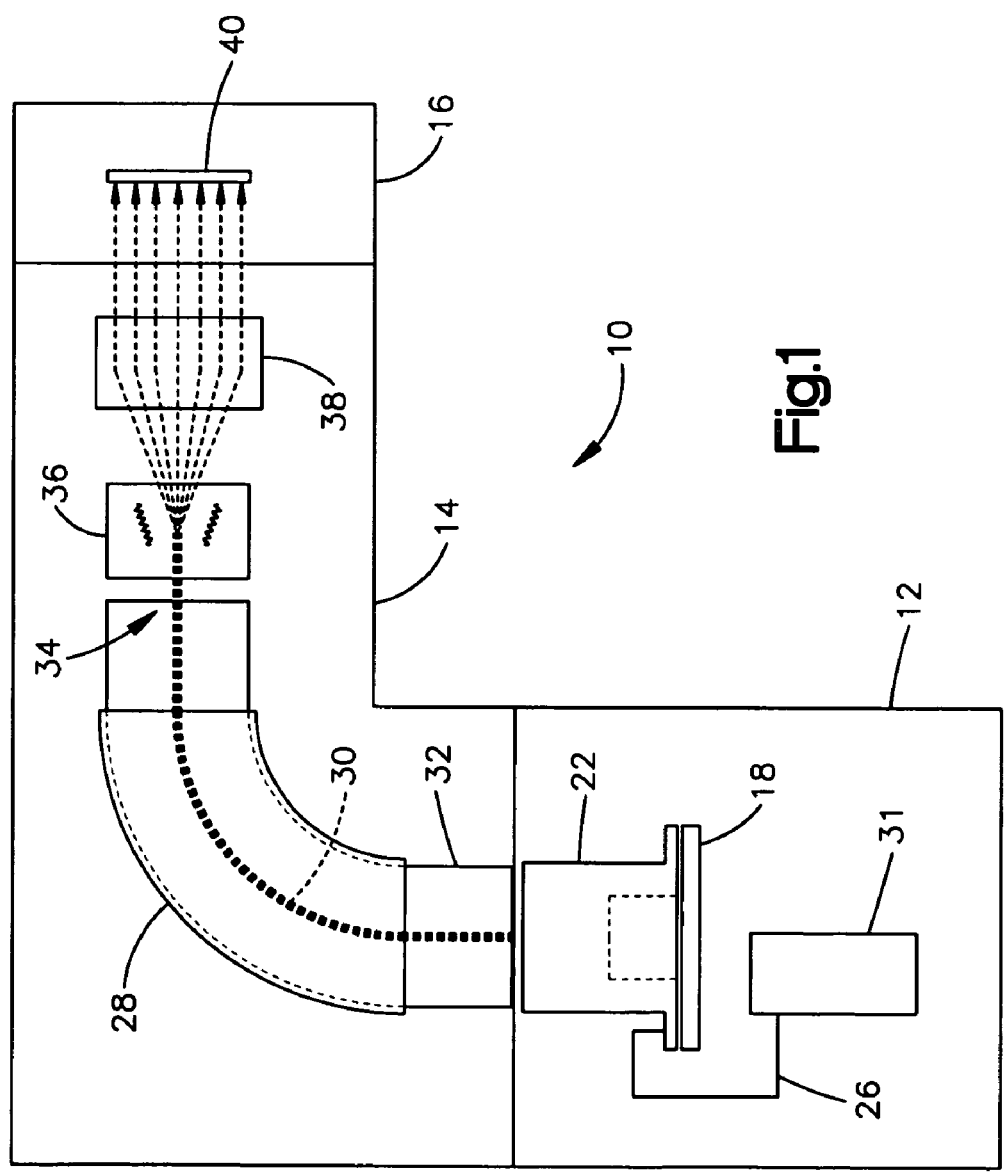
FIG. 1 is an overview schematic of an ion implanter constructed in accordance with the invention.
Figure 2:
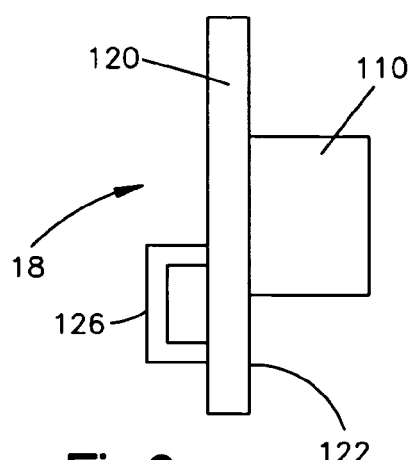
FIG. 2 is side elevation view of a ion source arc chamber.
Figure 3:
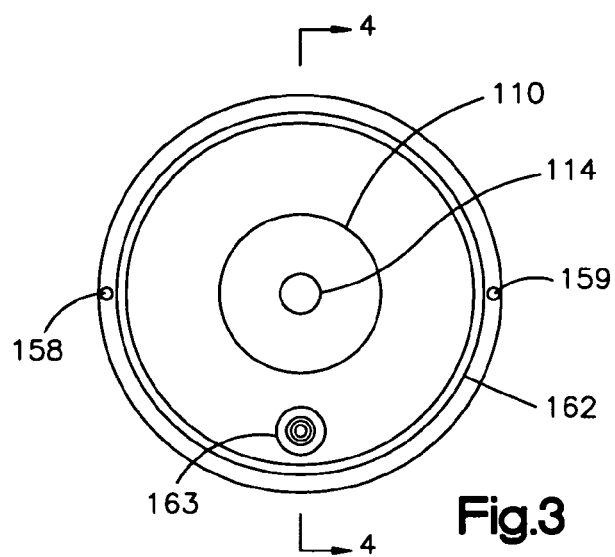
FIG. 3 is a bottom plan view of the ion source arc chamber of FIG. 2.
Figure 5:
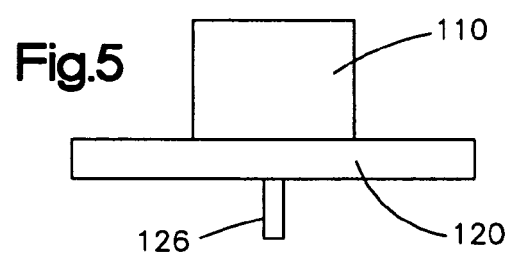
FIG. 5 is a side elevation view of the ion source arc chamber.
Figure 4:
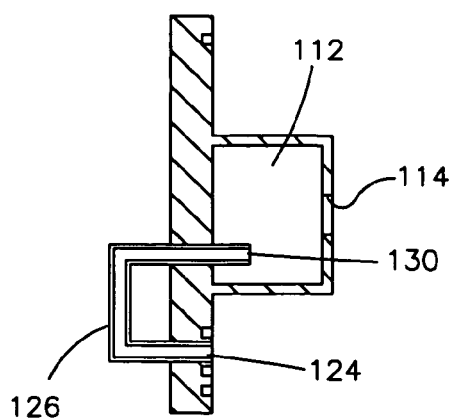
FIG. 4 is section view as seen from the plane 4—4 of FIG. 3.
Figure 6:
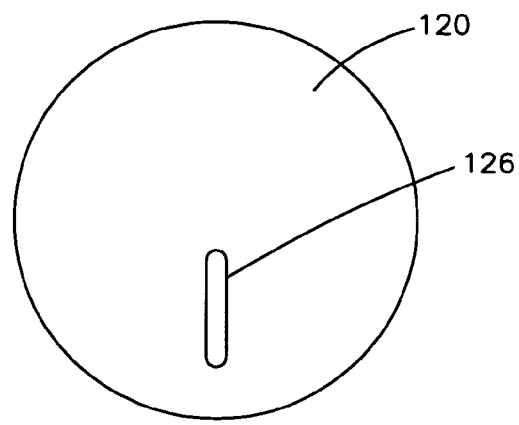
FIG. 6 is a top plan view of the ion source arc chamber.

FIG. 1 is a schematic depiction of a typical ion implantation system 10 having a terminal 12, a beamline assembly 14, and an end station 16. The terminal 12 includes an ion source 18 that produces and directs an ion beam 30 to the beamline assembly 14. The source 18 is mounted to a source housing 22. Suitable source materials are gasses delivered by a gas source 31 through a gas feed line 26.

The beamline assembly 14 consists of a beamguide 32 and a mass analyzer 28 in which a magnetic field is established to pass only ions of appropriate charge-to-mass ratio through a resolving aperture 34 to a workpiece 40 (e.g., a semiconductor wafer, display panel, etc.) in the end station 16. The ion source 18 generates charged ions that are extracted from the source 18 and formed into the ion beam 30, which is directed along a beam path in the beamline assembly 14 to the end station 16. The ion beam path is typically evacuated to reduce the probability of ions being deflected from the beam path through collisions with air molecules.

Low energy implanters are typically designed to provide ion beams of a few thousand electron volts (keV) up to around 80–100 keV, whereas high energy implanters can employ linear acceleration (linac) apparatus (not shown) between the mass analyzer 28 and the end station 16, so as to accelerate the mass analyzed beam 30 to higher energies, typically several hundred keV, wherein DC acceleration is also possible. High energy ion implantation is commonly employed for deeper implants in the workpiece 40. Conversely, high current, low energy ion beams 30 are typically employed for high dose, shallow depth ion implantation.

Different forms of end stations 16 are found in implanters. "Batch" type end stations can simultaneously support multiple workpieces 40 on a rotating support structure, with the workpieces 40 being rotated through the path of the ion beam until all the workpieces 40 are completely implanted. A "serial" type end station, on the other hand, supports a single workpiece 40 along the beam path for implantation, whereby multiple workpieces 40 are implanted one at a time in serial fashion, with each workpiece 40 being completely implanted before implantation of the next workpiece 40 begins.

The exemplary implantation system 10 of FIG. 1 includes a serial end station 16, wherein the beamline assembly 14 includes a lateral scanner 36 that receives the ion beam 30 having a relatively narrow profile (e.g., a "pencil" beam), and scans the beam 30 back and forth in the X-direction to spread the beam 30 out into an elongated "ribbon" profile, having an effective X-direction width that is at least as wide as the workpiece 40. The ribbon beam 30 is then passed through a parallelizer 38 that directs the ribbon beam generally parallel to the Z-direction toward the workpiece 40 (e.g., the parallelized beam 30 is generally normal to the workpiece surface). The workpiece 40 is mechanically translated in another orthogonal direction (e.g., a "Y" direction in and out of the page in FIG. 1), wherein a mechanical actuation apparatus (not shown) translates the workpiece 40 in the Y-direction during X-direction beam scanning by the scanner 36, whereby the beam 30 impacts on the entire exposed surface of the workpiece 40. For angled implants, the relative orientation of the beam 30 and the workpiece 40 may be adjusted accordingly.

Ion Source

FIGS. 2–15 disclose additional details of the ion source 18. The source includes an arc chamber 110 for ionizing a source material delivered into the arc chamber. A plasma is created within the chamber by means of a filament (not shown) or other energy sources. The chamber 110 bounds a region 112 and defines an exit aperture 114 that allows ions in the region to exit and be accelerated along a travel path to the end station. An arc chamber flange 120 is attached to the arc chamber and includes a first surface 122 that defines a gas inlet 124 which accepts an ionizable gas from a gas source 30. A tube 126 coupled to the flange 120 routes gas from the inlet to a gas outlet 130 which opens into the arc chamber interior 112. The arc chamber 110 and flange 120 to which the arc chamber is connected are replaceable at periodic intervals as a unit.

A source housing 22 for the arc source 18 includes a source flange 142 having a conforming surface 144 that sealingly engages the first surface 122 of the chamber flange around a region of the gas inlet 124. The flange 142 includes a throughpassage 146 that aligns with the gas inlet 124. A gas supply line 26 routes gas from the gas source 30 through the throughpassage 146 and into the gas inlet 124 of the arc chamber flange.

The flange 142 is supported within the source housing 22 by an elongated tube 152 that surrounds a travel path of ions leaving the arc chamber. The elongated tube 152 is attached to interior walls of the housing 22. The arc chamber flange 120 and the support flange 142 extend circumferentially around the arc chamber. The two flanges engage each other along a circumferential seal region that helps maintain a vacuum in the region of the ion implanter inside the tube 152. The outside of the flanges 120, 142 is maintained at atmospheric pressure during operation of the implanter. In accordance with the exemplary embodiment, the circumferential seal region is implemented by an O-ring seal 162 located in a groove in the flange 120 that extends slightly above the flanges surface 122. The inlet port 124 is radially inward of the O-ring seal 162 and is surrounded by a smaller diameter O-ring 163 in a groove that also extends slightly above the flange surface 122.

Figure 12:
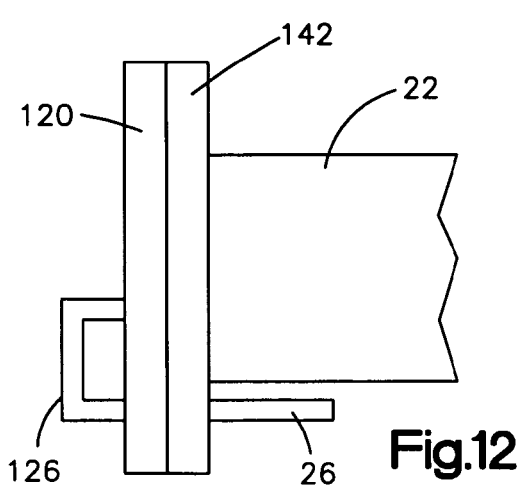
FIG. 12 is a side view of the arc chamber and support in engagement with each other.
Figure 13:
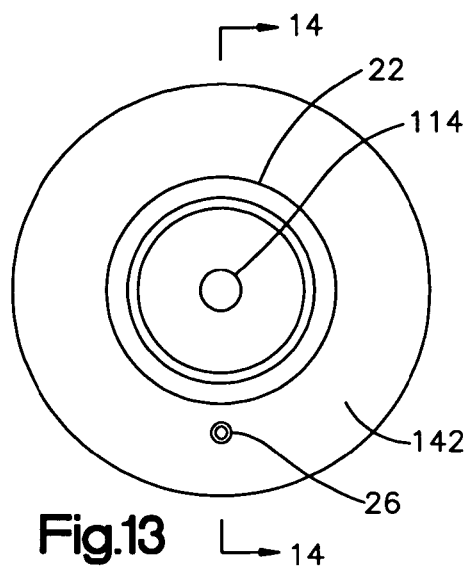
FIG. 13 is a plan view of the depiction of FIG. 12.
Figure 14:
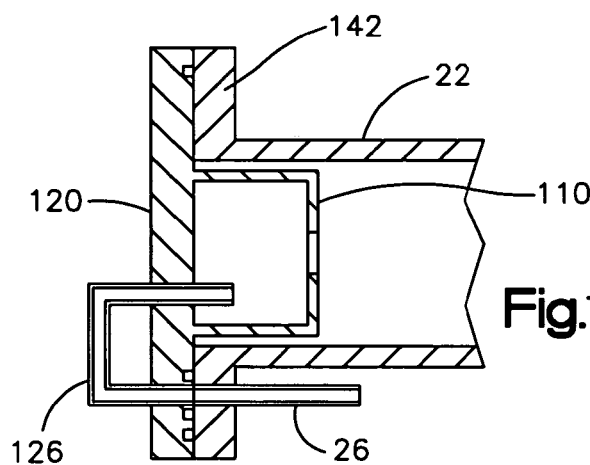
FIG. 14 is a section view from the plane 14—14 of FIG. 13.
Figure 15:
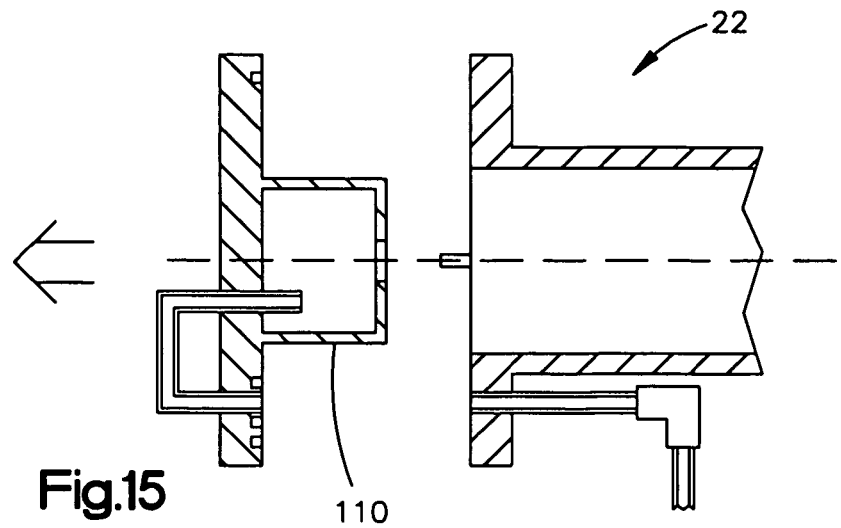
FIG. 15 is a section view showing the arc chamber and chamber support being separated during replacement of the arc chamber.

FIG. 12 shows the two flanges with the arc chamber mounted to the support. Locating pins 154, 156 insure correct mating of the seals 162, 163 with the support flange. The circumferential seal achieved by the o-ring seal 162 is an atmospheric seal that isolates high vacuum from atmosphere and must have very low leakage. The seal around the inlet 124 maintained by the O-ring 163 is a low pressure seal. It only has to withstand the pressure differential that builds up by gas flow through the gas line 150 into the arc chamber. Leakage on the order of a few percent across this seal is acceptable since it leads to loss of process gas, but does not reduce the overall implanter performance. The seal achieved by the O-ring 163 can be of moderate quality.

The arc chamber is a high wear item that is exchanged frequently. During arc chamber replacement at least one gas line connection has to be broken. In accordance with the disclosed embodiment the connection around both the seals 162, 163 are broken. The external gas line remains connected to the flange 142 and the high quality seal needed for the gas connection is not degraded. During use, the two flanges are held together by suitable fasteners (not shown) that compress the O-rings 162, 163 for initial sealing during pumping to vacuum. When the arc chamber is replaced these fasteners are loosened and the volume inside the tube 152 is vented to allow removal and replacement of the arc chamber without removing the gas supply line 26.

The present invention has been described with a degree of particularity. It is the intent, however, that the invention include all modifications and alterations from the disclosed design falling within the spirit or scope of the appended claims.

The invention claimed is:

1. For use with semiconductor processing equipment having an ion source, a workpiece support and a transport system for delivering ions from the source to a region of the workpiece support, said source comprising:

an arc chamber for ionizing a source material routed into an arc chamber interior; and a source housing for mounting said arc chamber within a vacuum environment in said semiconductor processing equipment;

said arc chamber including an arc chamber support flange having a gas inlet and a tube for routing gas from the gas inlet to a gas outlet which opens into said arc chamber interior; and said source housing including a source housing flange that sealingly engages with the arc chamber support flange to form a vacuum seal around a circumferential region of the arc chamber support flange that surrounds the gas inlet of said arc chamber support flange between an evacuated region within the arc chamber and a region at atmospheric pressure outside the source housing and further wherein the source housing flange includes a gas throughpassage which directs gas into the gas inlet of the arc chamber support flange.

2. The ion source of claim 1 comprising a seal member for sealing an engagement between the gas inlet of the arc chamber support flange and the throughpassage of the source housing flange.

3. The ion source of claim 1 comprising a seal of flexible material supported by one of said flanges that compresses when said arc chamber support flange is sealingly engaged with the source housing flange.

4. For use with semiconductor processing equipment having an ion source, a workpiece support and a transport system for delivering ions from the source to a region of the workpiece support, apparatus comprising:

an arc chamber for ionizing a source material routed into the arc chamber that defines an exit aperture for routing ions to the transport system and including an arc chamber mounting flange attached to the arc chamber and including a first surface that defines a gas inlet which accepts gas from a source and a gas outlet which opens into an arc chamber interior;

an arc chamber support for positioning the exit aperture of the arc chamber in a low pressure region of the semiconductor processing equipment and including a support flange having a conforming surface that sealingly engages the first surface of arc chamber mounting flange at a region of the gas inlet and further includes a throughpassage that aligns with the gas inlet of said arc chamber mounting flange; and a gas supply line for routing gas from a gas source through the throughpassage of the support flange and into the gas inlet of said arc chamber flange;

said arc chamber support including an extension portion that surrounds ions leaving the arc chamber exit and wherein the arc chamber flange and the support flange extend circumferentially around the arc chamber and engage each other along a circumferential seal region that maintains a vacuum region of the ion implanter on one side of the circumferential seal region and atmospheric pressure on an opposite side of the circumferential seal region.

5. The apparatus of claim 4 wherein the circumferential seal region includes an o ring seal in a groove in one of said flanges.

6. For use with semiconductor processing equipment having an ion source, a workpiece support and a transport system for delivering ions from the ion source to a region of the workpiece support, a method comprising:

positioning a source housing such that an interior portion of the source housing bounds a path of travel for ions and isolates the ions from an atmospheric region outside the source housing and includes a housing flange radially outward from the interior portion that bounds the path of travel and includes a gas throughpassage that extends through the housing flange;

providing a conduit for routing ionization gases to the gas throughpassage in the housing flange; and mounting a source arc chamber having an arc chamber flange in position for ionizing gases to the source housing such that a gas inlet of the arc chamber aligns with the throughpassage of the housing flange by bringing the arc chamber flange into engagement with the housing flange around a periphery of said housing flange and sealing an engagement between the arc chamber flange and the housing flange in the region of said periphery to seal an evacuated region within arc chamber from atmosphere outside the source housing.

7. The method of claim 6 additionally comprising sealing an engagement between the support flange and the gas inlet of the arc chamber.

* * * * *